United States Patent
Tanikawa

(10) Patent No.: US 10,096,367 B2
(45) Date of Patent: Oct. 9, 2018

(54) POWER SUPPLY CIRCUIT AND SEMICONDUCTOR STORAGE DEVICE

(71) Applicant: LAPIS Semiconductor Co., Ltd., Yokohama (JP)

(72) Inventor: Hiroyuki Tanikawa, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/726,387

(22) Filed: Oct. 6, 2017

(65) Prior Publication Data

US 2018/0102175 A1    Apr. 12, 2018

(30) Foreign Application Priority Data

Oct. 7, 2016 (JP) .................................. 2016-199171

(51) Int. Cl.
| | |
|---|---|
| *G11C 7/00* | (2006.01) |
| *G11C 16/30* | (2006.01) |
| *G11C 16/08* | (2006.01) |
| *H02M 3/07* | (2006.01) |

(52) U.S. Cl.
CPC .............. *G11C 16/30* (2013.01); *G11C 16/08* (2013.01); *H02M 3/07* (2013.01)

(58) Field of Classification Search
CPC ....... G11C 5/147; G11C 5/14; G11C 11/4074; G11C 16/30; G11C 5/143
USPC ............................................ 365/226, 189.11
See application file for complete search history.

(56) References Cited

U.S. PATENT DOCUMENTS

| | | | | |
|---|---|---|---|---|
| 2013/0083597 | A1* | 4/2013 | Nakamura | G11C 16/06 365/185.2 |
| 2016/0190928 | A1* | 6/2016 | Huang | H02M 3/07 365/189.11 |

FOREIGN PATENT DOCUMENTS

JP           2005020971           1/2005

\* cited by examiner

*Primary Examiner* — Son Dinh
(74) *Attorney, Agent, or Firm* — JCIPRNET

(57) ABSTRACT

A power supply circuit and a semiconductor storage device that can achieve low power consumption of the power supply circuit that includes a charge pump circuit are provided. The semiconductor storage device includes a charge pump unit which generates and outputs a boosted voltage by boosting a source voltage, a voltage monitoring unit that performs comparison and determination on magnitudes of a divided voltage obtained by dividing the boosted voltage and a predetermined reference voltage, a charge pump control unit that causes the charge pump unit to operate when the divided voltage is equal to or lower than the reference voltage and causes the charge pump unit to stop when the divided voltage is higher than the reference voltage based on a result of the comparison and determination, and a voltage monitoring control unit that causes the voltage monitoring unit to intermittently stop.

13 Claims, 7 Drawing Sheets

POWER SUPPLY CIRCUIT AND SEMICONDUCTOR STORAGE DEVICE

CROSS-REFERENCE TO RELATED APPLICATION

This application claims the priority benefit of Japan Application no. 2016-199171, filed on Oct. 7, 2016. The entirety of the above-mentioned patent application is hereby incorporated by reference herein and made a part of this specification.

BACKGROUND OF THE INVENTION

Field of the Invention

The present invention elates to a power supply circuit, and particularly to a power supply circuit that has a charge pump which boosts a source voltage, and a semiconductor storage device in which the power supply circuit is formed.

Description of Related Art

A non-volatile semiconductor memory such as a flash memory needs a higher voltage than a source voltage supplied from outside as a voltage to be applied to memory cells when reading, writing or erasure of data is performed. Thus, in the non-volatile semiconductor memory, a booster circuit such as a charge pump boosts the source voltage supplied from outside to a voltage value that is necessary for reading, writing, or erasing data. In addition, to maintain the boosted voltage generated by the charge pump at a target value, it is known a memory that includes a voltage divider for detecting a voltage value of a boosted voltage and a comparator for performing comparison and determination on magnitudes of the voltage value detected by the voltage divider and a reference voltage and controls operation and stopping of a charge pump based on the results of the comparison and determination (e.g., see Patent Document 1).

RELATED ART DOCUMENT

Patent Documents

[Patent Document 1] Japanese Unexamined Patent Application Publication No. 2005-20971

However, such a charge pump circuit includes a voltage divider and a comparator which consumes a relatively large amount of current, and thus difficulty in lowering the power consumption is a problem.

An objective of the present invention is to provide a power supply circuit including a charge pump that can achieve low power consumption and a semiconductor storage device which includes the power supply circuit.

SUMMARY OF THE INVENTION

A power supply circuit according to the embodiment of the present invention is a power supply circuit that includes a charge pump unit that generates and outputs a boosted voltage by boosting a source voltage, and has a voltage monitoring unit that performs comparison and determination on magnitudes of a divided voltage obtained by dividing the boosted voltage and a predetermined reference voltage; a charge pump control unit that causes the charge pump unit to operate when the divided voltage is equal to or lower than the reference voltage based on a result of the comparison and determination and causes an operation of the charge pump unit to stop when the divided voltage is higher than the reference voltage based on a result of the comparison and determination; and a voltage monitoring control unit that causes the voltage monitoring unit to intermittently stop.

In addition, a semiconductor storage device according to the embodiment of the present invention is a semiconductor storage device that includes a power supply circuit that includes a charge pump unit which generates a boosted voltage by boosting a source voltage; a memory cell array in which memory cells are formed at intersections of a plurality of word lines and a plurality of bit lines crossing each of the word lines; and a row decoder which supplies a selection voltage to each of the word lines based on the boosted voltage, and the power supply circuit includes a voltage monitoring unit that performs comparison and determination on magnitudes of a divided voltage obtained by dividing the boosted voltage and a predetermined reference voltage, a charge pump control unit that causes the charge pump unit to operate when the divided voltage is equal to or lower than the reference voltage based on a result of the comparison and determination and causes an operation of the charge pump unit to stop when the divided voltage is higher than the reference voltage based on a result of the comparison and determination, and a voltage monitoring control unit that causes the voltage monitoring unit to intermittently stop.

According to the embodiment of the present invention, the voltage monitoring unit that is provided to cause values of a boosted voltage boosted by the charge pump unit to converge on a predetermined target voltage is intermittently stopped. Accordingly, low power consumption of the power supply circuit is achieved without significantly lowering the value of the boosted voltage.

DETAILED DESCRIPTION OF THE EMBODIMENTS

Embodiments of the present invention will be described below in detail with reference to the drawings.

Figure 1:
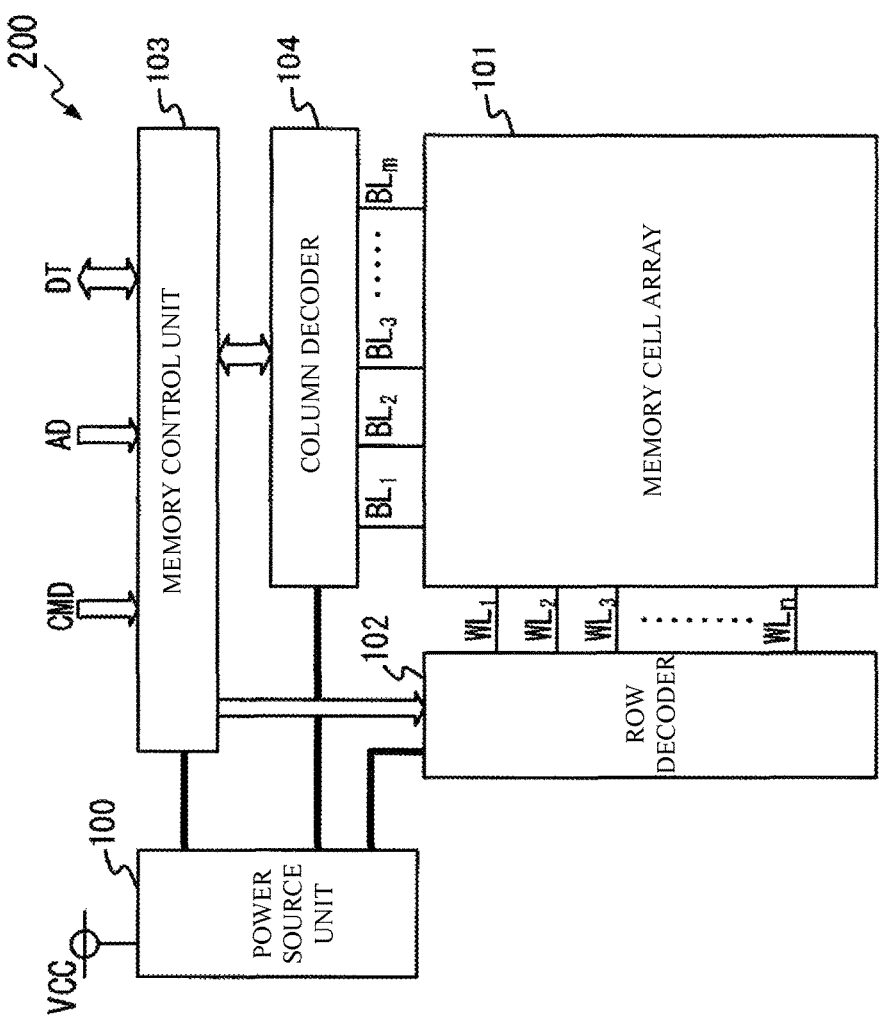
FIG. 1 is a block diagram showing a configuration of a semiconductor storage device 200 that includes a power supply circuit according to the embodiment of the present invention.

FIG. 1 is a block diagram showing a schematic configuration of a semiconductor storage device 200 that includes a power supply circuit according to the embodiment of the present invention. The semiconductor storage device 200 is, for example, a NAND flash memory, and has a power source unit 100, a memory cell array 101, a row decoder 102, a memory control unit 103, and a column decoder 104.

The memory cell array 101 includes a plurality of bit lines $BL_1$ to $BL_m$ (m is an integer greater than or equal to 2) that are arranged in a column direction and a plurality of word lines $WL_1$ to $WL_n$ (n is an integer greater than or equal to 2) that are arranged in a row direction and orthogonal to the bit lines $BL_1$ to $BL_m$, and memory cells (not illustrated) are formed at intersections of the bit lines BL and the word lines WL. Each of the memory cells performs writing and reading of binary or multi-value data in accordance with a selection voltage supplied via a word line WL and a writing voltage or a reading voltage supplied via a pair of the bit lines BL.

The row decoder 102 applies a selection voltage for data reading or writing to the word lines $WL_1$ to $WL_n$ of the memory cell array 101 in accordance with a control signal supplied from the memory control unit 103.

The column decoder 104 applies a ground potential, a reading voltage, or a writing voltage to the bit lines $BL_1$ to $BL_m$ of the memory cell array 101 in accordance with a control signal supplied from memory control unit 103.

The memory control unit 103 supplies various control signals for instructing reading, writing, or erasure of data to the row decoder 102 and the column decoder 104 in accordance with various memory control signals CMD (a chip enable signal, a writing enable signal, a reading enable signal, an address latch enable signal, a command latch enable signal, and the like) supplied from outside. Here, during data reading, for example, the memory control unit 103 supplies a selection signal indicating that a selection voltage is to be applied to a word line WL which corresponds to an address indicated by an address signal AD to the row decoder 102. Furthermore, the memory control unit 103 supplies a control signal indicating that a ground potential or a reading voltage is to be applied to the bit lines $BL_1$ to $BL_m$ to the column decoder 104 (reading control) during the period. Through the reading control, the memory cells emit a current according to electric charge accumulated therein to the bit lines BL. At this time, the column decoder 104 supplies a reading current value indicating a value of current emitted to the bit lines BL to the memory control unit 103. The memory control unit 103 determines a value of data based on the reading current value, and outputs reading data indicating the value as data DT.

The power source unit 100 generates an internal source voltage for operating the memory control unit 103 using a source voltage VCC supplied from an external power source (not illustrated) and supplies the voltage to the memory control unit 103. In addition, the power source unit 100 generates a writing voltage, a reading voltage, and an erasure voltage each having a higher value than the source voltage VCC based on the source voltage VCC, and supplies the voltages to the column decoder 104.

Furthermore, the power source unit 100 generates a selection voltage having a higher value than the source voltage VCC based on the source voltage VCC and supplies the voltage to the row decoder 102.

Figure 2:
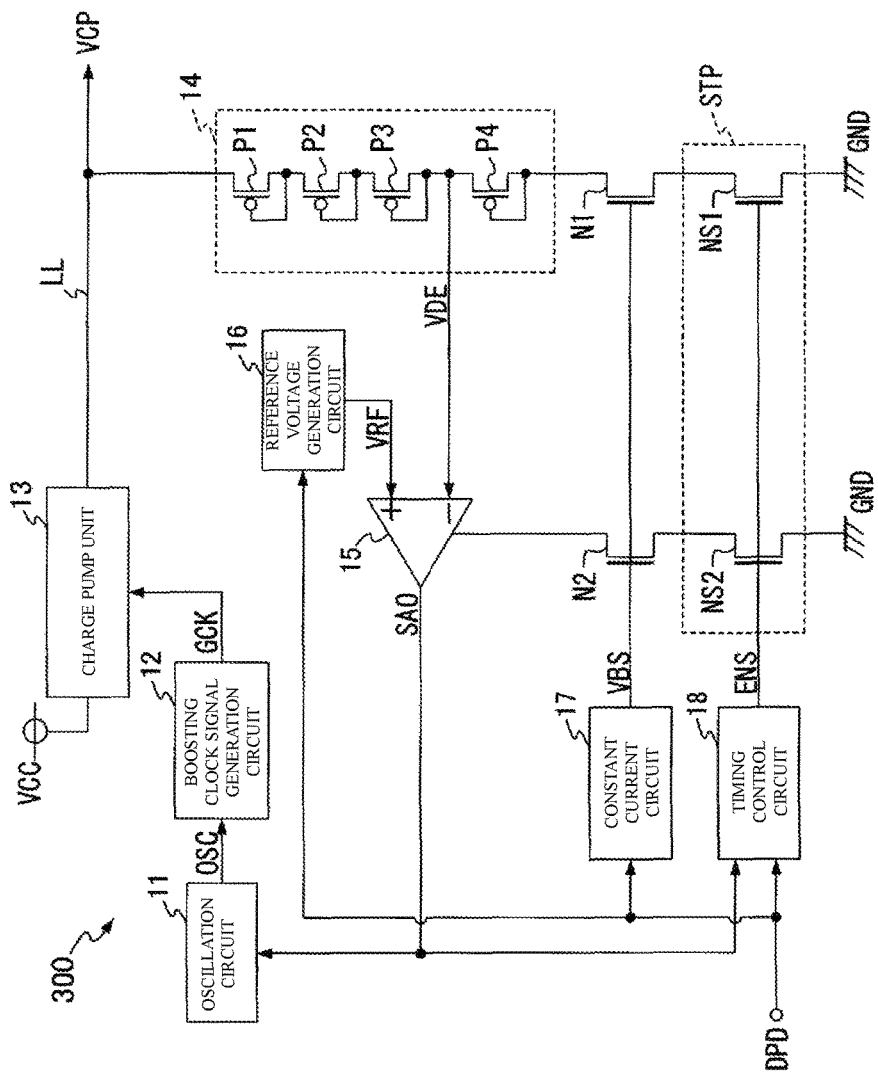
FIG. 2 is a block diagram showing an example of a configuration of a power supply circuit 300 according to the embodiment of the present invention.

FIG. 2 is a block diagram showing an example of a configuration of a power supply circuit 300 which is included in the power source unit 100 and generates a selection voltage for data reading as a boosted voltage VCP.

In FIG. 2, an oscillation circuit 11 receives a binary voltage monitoring signal SAO indicating a logic level 0 or 1, performs an oscillation operation when the voltage monitoring signal SAO indicates, for example, the logic level 1, and supplies a reference clock signal OSC having a predetermined oscillation frequency to a boosting clock signal generation circuit 12. On the other hand, when the voltage monitoring signal SAO indicates, for example, the logic level 0, the oscillation circuit 11 stops the oscillation operation and supplies the reference clock signal OSC that is fixed to either state of the logic level 0 and 1 to the boosting clock signal generation circuit 12.

The boosting clock signal generation circuit 12 converts the reference clock signal OSC into a drive clock signal GCK having a level for driving a charge pump only when the reference clock signal OSC is in an oscillation state, and supplies the signal to a charge pump unit 13.

That is, a charge pump control unit that includes the oscillation circuit 11 and the boosting clock signal generation circuit 12 performs operation and stop control of the charge pump unit 13 in accordance with the voltage monitoring signal SAO.

The charge pump unit 13 performs a so-called charge pump operation that is intermittently applying a voltage to a voltage supply line LL in accordance with the drive clock signal GCK to gradually increase the voltage of the voltage supply line LL. On the other hand, the charge pump unit 13 stops the charge pump operation in a period in which no drive clock signal GCK is supplied, i.e., when the voltage monitoring signal SAO indicates, for example, the logic level 0. Thus, the voltage of the voltage supply line LL gradually decreases after the charge pump operation stops.

The voltage generated on the voltage supply line LL through the operation of the charge pump unit 13 is supplied to the row decoder 102 as a boosted voltage VCP.

A voltage divider 14 includes, for example, p-channel metal oxide semiconductor (MOS) transistors P1 to P4 each of which is connected to a diode. The transistors P1 to P4 are in a cascade connection, and a source terminal of the transistor P1 at an end of the transistors P1 to P4 is connected to the voltage supply line LL. In addition, a drain terminal of the transistor P4 at the other end of the transistors P1 to P4 is connected to a drain terminal of an n-channel MOS transistor N1. Note that a ladder resistor formed by connecting a plurality of resistive elements in series may be employed as the voltage divider 14.

A bias voltage VBS for determining a value of a current flowing in the voltage divider 14 is supplied to a gate tell final of the transistor N1 and a drain terminal of an n-channel MOS transistor NS1 is connected to a source terminal of the transistor N1.

A voltage monitoring activation signal ENS having a logic level 0 or 1 is supplied to a gate terminal of the transistor NS1, and a ground potential GND is applied to a source terminal of the transistor NS1. The transistor NS1 enters an on-state in accordance with the voltage monitoring activation signal ENS having the logic level 1, and supplies a voltage corresponding to the ground potential GND to a source terminal of the transistor N1. On the other hand, when the voltage monitoring activation signal ENS having the logic level 0 is supplied, the transistor NS1 enters an off-state, and stops supply of the voltage to the source terminal of the transistor N1.

Due to the above-described configuration, a current having a magnitude corresponding to the bias voltage VBS flows in the voltage divider 14 only in the period in which the transistor NS1 is in the on-state in accordance with the voltage monitoring activation signal ENS having the logic level 1. Thus, the voltage divider 14 supplies a voltage of the source terminal of the transistor P4, i.e., a voltage obtained by dividing the boosted voltage VCP of the voltage supply line LL, to a comparator 15 as a divided voltage VDE during this period. On the other hand, when the voltage monitoring activation signal ENS having the logic level 0 is supplied, the transistor NS1 enters an off-state, thus no current flows in the voltage divider 14, and therefore the voltage divider 14 stops its operation.

A reference voltage generation circuit 16 receives a deep power-down signal DPD indicating a standby mode or a power-down mode supplied from outside of the semiconductor storage device 200. Note that the deep power-down signal DPD indicates the power-down mode when low-power reading is performed with respect to the memory cell array 101, and indicates the standby mode when low-power reading is not performed.

The reference voltage generation circuit 16 supplies a reference voltage VRF having a voltage value corresponding to a target voltage which is a target of the boosted voltage VCP when the deep power-down signal DPD transitions from a state indicating the standby mode to a state indicating the power-down mode to the comparator.

The comparator 15 is configured as, for example, an operator/comparator, performs comparison and determination on magnitudes of values of the reference voltage VRF and the divided voltage VDE, and generates the voltage monitoring signal SAO having the logic level 1 when the divided voltage VDE is equal to or lower than the reference voltage VRF, for example. On the other hand, when the divided voltage VDE is higher than the reference voltage VRF, the comparator 15 generates, for example, the voltage monitoring signal SAO having the logic level 0. The comparator 15 supplies the voltage monitoring signal SAO to the oscillation circuit 11 and a timing control circuit 18.

In short, a voltage monitoring unit including the voltage divider 14, the comparator 15, and the reference voltage generation circuit 16 performs comparison and determination on magnitudes of values of the divided voltage VDE obtained by dividing the boosted voltage VCP and the predetermined reference voltage VRF, and generates the voltage monitoring signal SAO indicating a result of the comparison and determination.

Note that the comparator 15 is disposed with a differential pair (not illustrated) which generates a voltage corresponding to a difference between voltage values of the reference voltage VRF and the divided voltage VDE by flowing a current having a magnitude corresponding to the reference voltage VRF in a first line and flowing a current having a magnitude corresponding to the divided voltage VDE in a second line, and a bias transistor which sets an operation current that flows in the differential pair. In FIG. 2, in order to illustrate a clear configuration, this bias transistor is depicted outside the comparator 15 as an n-channel MOS transistor N2.

A bias voltage VBS for determining a value of an operation current that flows in the comparator 15 is supplied to a gate terminal of the transistor N2, and a drain terminal of a transistor NS2 is connected to a source terminal of the transistor N2.

The above-described voltage monitoring activation signal ENS is supplied to a gate terminal of the transistor NS2, and a ground potential GND is applied to a source terminal of the transistor NS2. The transistor NS2 enters an on-state in accordance with the voltage monitoring activation signal ENS having the logic level 1, and supplies a voltage corresponding to the ground potential GND to the source terminal of the transistor N2. On the other hand, when the voltage monitoring activation signal ENS having the logic level 0 is supplied, the transistor NS2 enters an off-state, stops the supply of the voltage to the source terminal of the transistor N2, and thus causes an inflow of an operation current into the comparator 15 to stop. Accordingly, the comparator 15 stops its operation.

A constant current circuit 17 supplies a constant current to a line, which is connected to gate terminals of the above-described transistors N1 and N2, when the deep power-down signal DPD indicates the power-down mode, thereby generating the bias voltage VBS having a predetermined constant value and supplying the voltage to the gate terminals of the transistors N1 and N2. In addition, the constant current circuit 17 stops supply of the constant current when the deep power-down signal DPD indicates the standby mode.

The timing control circuit 18 generates the voltage monitoring activation signal ENS having the logic level 0 which deactivates a voltage monitoring operation with respect to the boosted voltage VCP when the deep power-down signal DPD indicates the standby mode. Then, when the deep power-down signal DPD transitions to a state indicating the power-down mode, the timing control circuit 18 switches the voltage monitoring activation signal ENS to the state of the logic level 1 for activating the voltage monitoring operation. Here, the timing control circuit 18 maintains the state of the logic level 1 of the voltage monitoring activation signal ENS until the voltage monitoring signal SAO transitions from the state of the logic level 1 to the state of the logic level 0, that is, until the divided voltage VDE becomes higher than the reference voltage VRF. That is, the timing control circuit 18 generates the voltage monitoring activation signal ENS having the logic level 1 until the value of the boosted voltage VCP becomes higher than a target voltage VWL serving as a target. Then, the timing control circuit 18 generates the voltage monitoring activation signal ENS as described below from when the voltage monitoring signal SAO transitions from the state of the logic level 1 to the state of the logic level 0 for the first time after the deep power-down signal DPD transitions from the standby mode to the state of the power-down mode.

That is, the timing control circuit 18 generates the voltage monitoring activation signal ENS as described below at predetermined intervals T1 in which the voltage monitoring activation signal ENS enters the state of the logic level 1 for activating the voltage monitoring operation only in activation periods T2 (T1>T2), and enters the state of the logic level 0 for deactivating the voltage monitoring operation in other periods. Note that the timing control circuit 18 includes a timer that measures the predetermined interval T1 and the activation periods T2.

The timing control circuit 18 supplies the voltage monitoring activation signal ENS to the transistors NS1 and NS2 serving as a current blocking circuit STP. Thus, while the voltage monitoring activation signal ENS is in a state of deactivating the voltage monitoring operation (e.g., the logic level 0), the transistors NS1 and NS2 are both in an off-state, and thus supply of the current flowing in the voltage divider 14 and the operation current for operating the comparator 15 is blocked.

An operation of the power supply circuit 300 having the configuration shown in FIG. 2 will be described below with reference to the time chart shown in FIG. 3.

When the deep power-down signal DPD transitions from the standby mode to the state of the power-down mode, the bias voltage VBS is supplied to the gate terminals of the transistors N1 and N2, and the voltage monitoring activation signal ENS having the logic level 1 for activating the voltage monitoring operation is supplied to the gate terminals of the transistors NS1 and NS2.

Accordingly, the voltage divider 14 and the comparator 15 start operations. Note that, since the divided voltage VDE is lower than the reference voltage VRF, that is, the boosted voltage VCP is lower than the target voltage VWL as shown in FIG. 3 at the time point at which the voltage divider 14 and the comparator 15 start operations, the comparator 15 supplies the voltage monitoring signal SAO having the logic level 1 to the oscillation circuit 11 and the timing control circuit 18. Then, the oscillation circuit 11 and the boosting clock signal generation circuit 12 supply a drive clock signal GCK for executing a charge pump operation to the charge pump unit 13. Accordingly, the charge pump unit 13 starts a charge pump operation, which gradually raises the value of the boosted voltage VCP as shown in FIG. 3.

Figure 3:
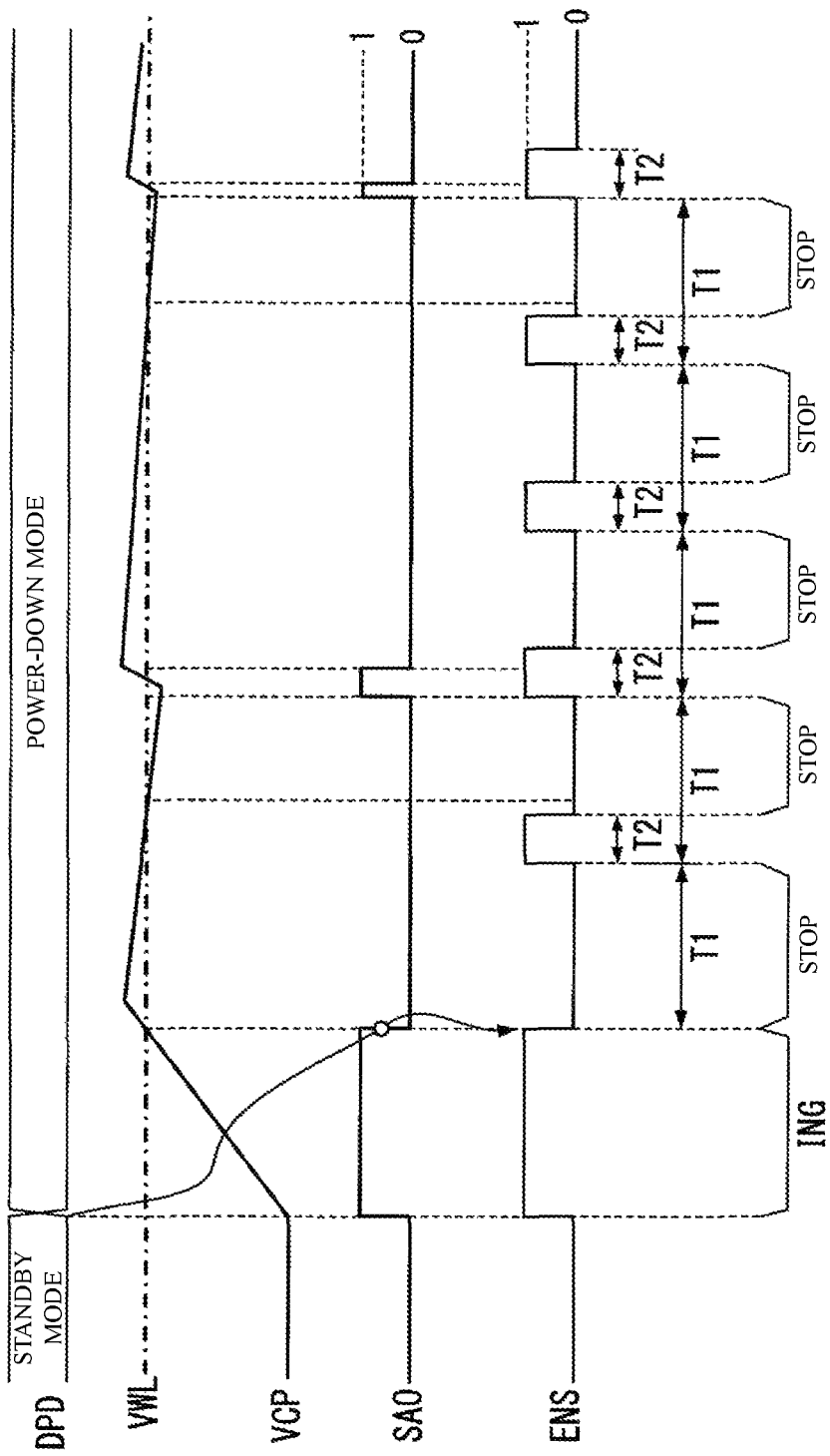
FIG. 3 is a time chart showing an example of an internal operation of the power supply circuit 300.

Then, when the voltage value of the boosted voltage VCP reaches the target voltage VWL, the comparator 15 switches the voltage monitoring signal SAO from the logic level 1 to the logic level 0 as shown in FIG. 3. That is, the comparator 15 generates the voltage monitoring signal SAO having the logic level 1 that promotes execution of the charge pump operation during an initial boosting period ING which is from the time point at which the deep power-down signal DPD transitions from the standby mode to the state of the power-down mode to the time point at which the voltage value of the divided voltage VDE reaches a voltage value greater than the reference voltage VRF for the first time as shown in FIG. 3.

Here, after the above-described initial boosting period ING elapses from the time at which the deep power-down signal DPD transitions from the standby mode to the state of the power-down mode, the timing control circuit 18 generates the voltage monitoring activation signal ENS having the logic level 1 only in the predetermined activation periods T2 at each of the predetermined intervals T1 as shown in FIG. 3.

That is, a voltage monitoring control unit including the timing control circuit 18 and the current blocking circuit STP intermittently sets the voltage monitoring unit including the voltage divider 14, the comparator 15 and the reference voltage generation circuit 16 to the stop state after the initial boosting period ING elapses.

Note that the predetermined interval T1 is set to be a time longer than a time from a time point when the charge pump unit 13 transitions from an operation state to a stop state to a time point when the voltage value of the divided voltage VDE decreases due to current consumption of a load (the row decoder 102) of a supply destination of the boosted voltage VCP and reaches a minimum allowable voltage of the load in the state in which the value of the divided voltage VDE is higher than the value of the reference voltage VRF.

In addition, the activation period T2 is set to a period equal to or longer than a time obtained by adding a circuit delay time, which is taken by the voltage divider 14 to generate the divided voltage VDE having a magnitude corresponding to the boosted voltage VCP of the voltage supply line LL, to a boosting operation period with respect to the charge pump unit 13. Note that the boosting operation period is a time from a transition time point when the divided voltage VDE, which was higher than the reference voltage VRF, transitions to being lower than the reference voltage VRF to a time point at which the value of the divided voltage VDE reaches the reference voltage VRF through a boosting operation performed by the charge pump unit 13.

As described above, the voltage monitoring operation by the voltage divider 14 and the comparator 15 is performed only during the activation periods T2 at the predetermined interval T1 (T1>T2) after the initial boosting period ING in the power supply circuit 300 as shown in FIG. 3. That is, the voltage monitoring operation performed by the voltage divider 14 and the comparator 15 is intermittently stopped after the initial boosting period ING.

In short, in the power supply circuit 300 including the charge pump unit 13 which generates and outputs the boosted voltage VCP obtained by boosting the source voltage VCC, the voltage monitoring unit including the voltage divider 14, the comparator 15, and the reference voltage generation circuit 16 performs comparison and determination on the magnitudes of the voltage values of the divided voltage VDE obtained by dividing the boosted voltage VCP and the predetermined reference voltage VRF. Here, a charge pump control unit including the oscillation circuit 11 and the boosting clock signal generation circuit 12 causes the charge pump unit 13 to operate when the divided voltage VDE is equal to or lower than the reference voltage VRF. On the other hand, when the divided voltage VDE is higher than the reference voltage VRF, the charge pump control unit causes the operation of the charge pump unit 13 to stop. At that time, the voltage monitoring control unit including the timing control circuit 18 and the current blocking circuit STP intermittently sets the voltage monitoring unit to be in the stop state.

Thus, the voltage divider 14 and the comparator 15 are in the operation stop state in periods other than the activation periods T2 after the initial boosting period ING as shown in FIG. 3, and for that reason, power consumption of currents flowing through the voltage divider 14 and the comparator 15 significantly decreases, which leads to a drop in an amount of power consumption.

In the power supply circuit 300 shown in FIG. 2, the timing control circuit 18 having a timer function is provided to control operation states and stop states of the voltage divider 14 and the comparator 15, and thus operations of the timer cause an increasing amount of power consumption. However, since a decrement of the amount of power consumption of the current flowing in the voltage divider 14 due to the control shown in FIG. 3 is greater than an increment of the amount of power consumption due to operations of the timer, a decrease in an amount of overall power consumption of the power supply circuit can be achieved.

In addition, the voltage divider 14 and the comparator 15 are intermittently activated even after the initial boosting period ING as shown in FIG. 3, and thus the charge pump unit 13 performs the charge pump operation. Thus, according to the power supply circuit 300 shown in FIG. 2, it is possible to maintain the voltage value of the boosted voltage VCP in the vicinity of the target voltage VWL even in the power-down mode. Thus, if the power supply circuit 300 shown in FIG. 2 is employed as a power supply circuit which generates a selection voltage for reading data of a flash memory, data can always be read at a high speed even in the power-down mode.

Note that, in the above-described embodiment, the timing control circuit 18 maintains the voltage monitoring activation signal ENS in the state of the logic level 1 through the activation periods T2 at each of the predetermined intervals T1 after the initial boosting period ING. However, when the voltage value of the boosted voltage VCP reaches the target voltage VWL due to the charge pump operation in the periods, the timing control circuit 18 may switch the voltage monitoring activation signal ENS to the state of the logic level 0, without waiting for the activation periods T2.

Figure 4:
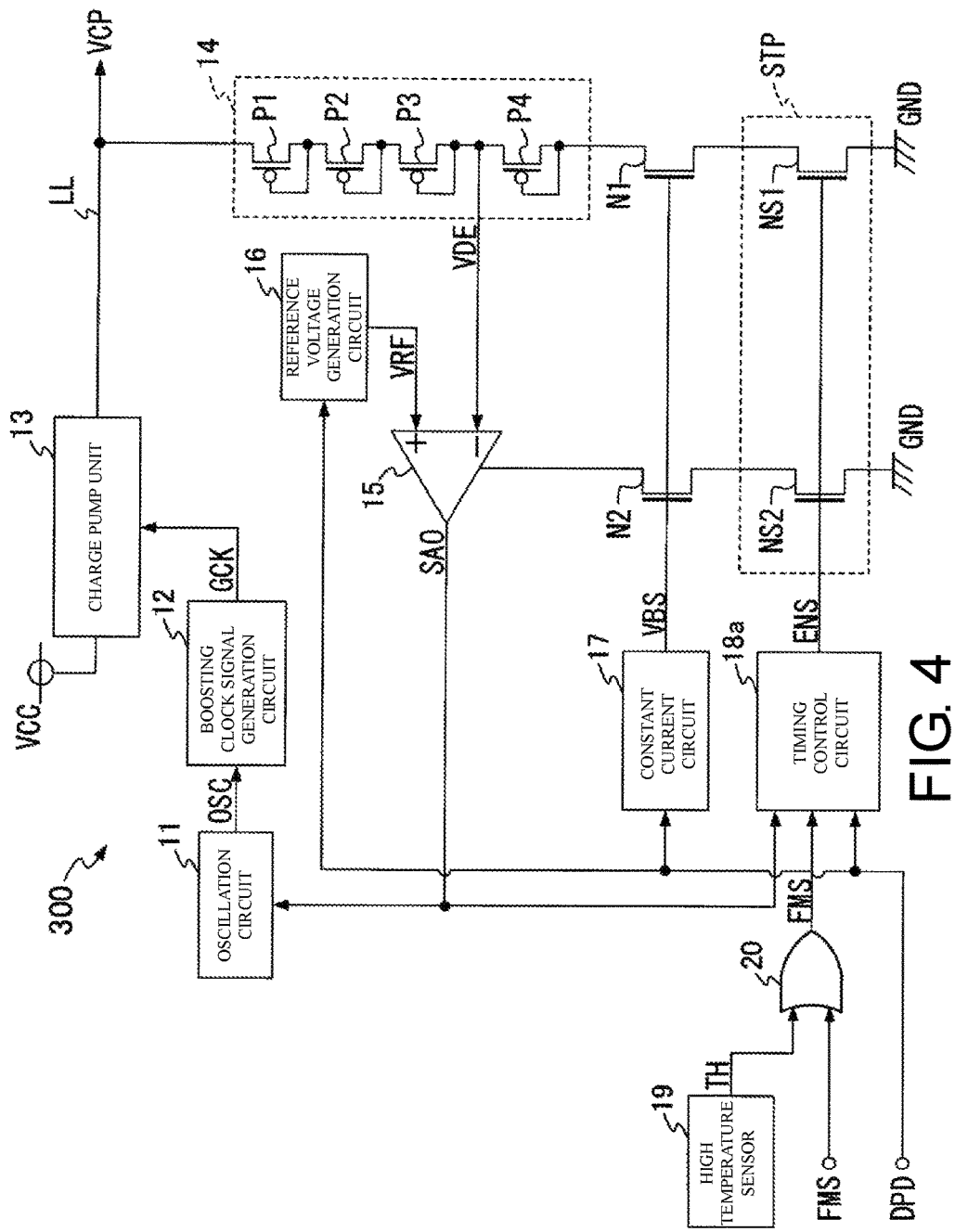
FIG. 4 is a block diagram showing another example of a configuration of the power supply circuit 300.
Figure 5:
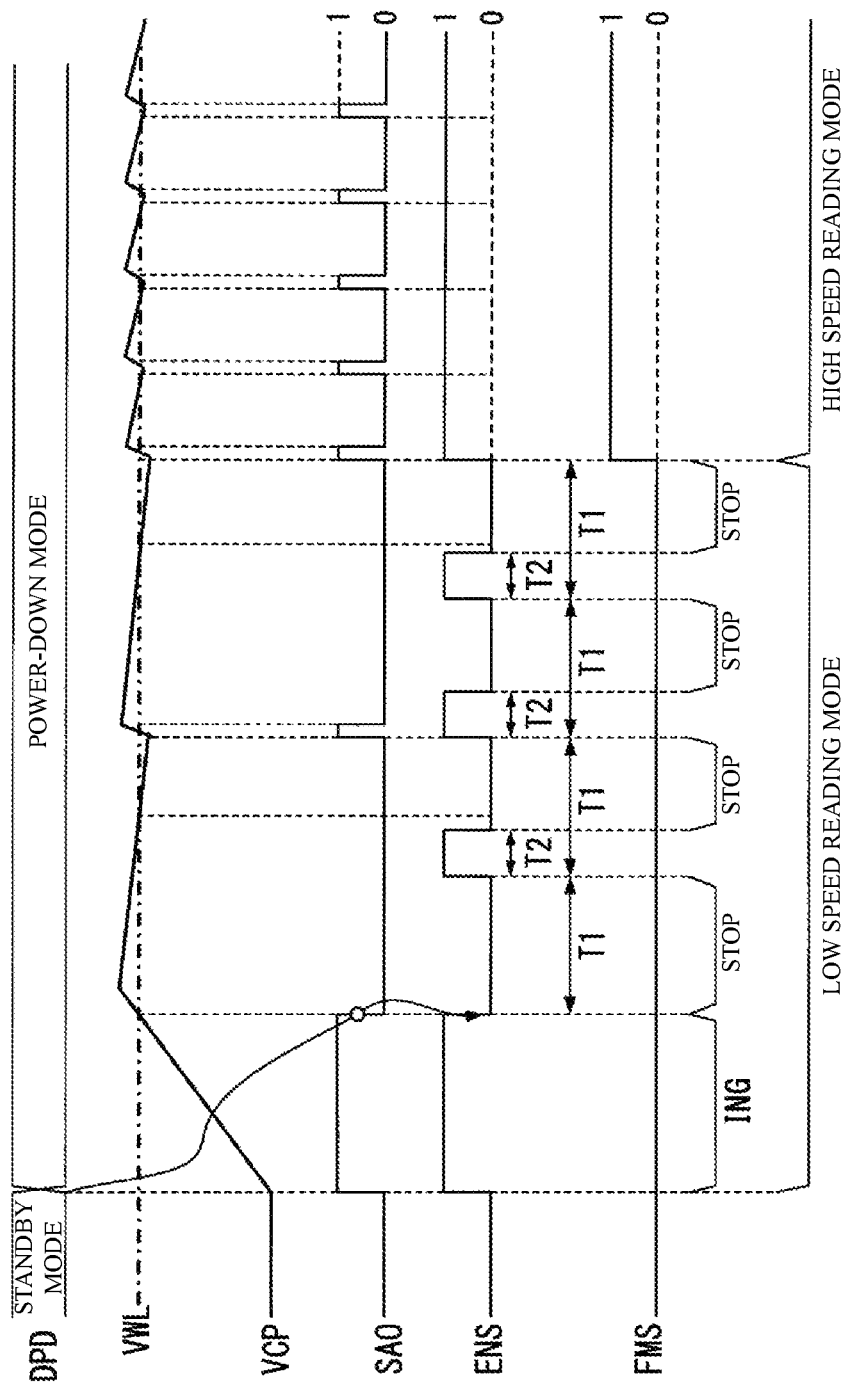
FIG. 5 is a time chart showing an example of an internal operation of the power supply circuit 300 when the configuration shown in FIG. 4 is employed.

FIG. 4 is a block diagram showing another example of a configuration of the power supply circuit 300, and FIG. 5 is a time chart showing an example of an operation of the power supply circuit 300 that has the configuration shown in FIG. 4. Note that, the configuration shown in FIG. 4 is the same as that shown in FIG. 2 except for the constituent structure in which a timing control circuit 18a is employed in place of the above-described timing control circuit 18, and a high-temperature sensor 19 and an OR gate 20 are newly added thereto.

The high-temperature sensor 19 detects a temperature around itself, and supplies a high temperature detection signal TH with a logic level 1 indicating a high temperature state to the OR gate 20 when the detected temperature is higher than a predetermined temperature, and supplies a high temperature detection signal TH with a logic level 0 indicating a suitable temperature state is supplied to the OR gate 20 when the detected temperature is equal to or lower than the predetermined temperature.

To the OR gate 20, a reading mode signal FMS supplied from outside of the semiconductor storage device 200 is supplied along with the high temperature detection signal TH. The reading mode signal FMS has, for example, a logic level 1 indicating a high speed reading mode when data stored in the memory cell array 101 is read at a high speed, and has a logic level 0 indicating a low speed reading mode when the data is read at a low speed.

The OR gate 20 supplies the reading mode signal FMS with the logic level 1 indicating the high speed reading mode to the timing control circuit 18a when the high temperature detection signal TH has the logic level 1 or the reading mode signal FMS has the logic level 1 indicating the high speed reading mode. On the other hand, when the high temperature detection signal TH has the logic level 0 and the reading mode signal FMS has the logic level 0 indicating a low speed reading mode, the OR gate 20 supplies the reading mode signal FMS with the logic level 0 indicating the low speed reading mode to the timing control circuit 18a.

When the reading mode signal FMS has the logic level 0 indicating the low speed reading mode, the timing control circuit 18a generates the voltage monitoring activation signal ENS with the logic level 1 only in the activation periods T2 at each predetermined interval T1 after the initial boosting period ING as shown in FIG. 5 and generates the voltage monitoring activation signal ENS with the logic level 0 in other periods. That is, while the inside of the power supply circuit is in a suitable temperature state in which a temperature is equal to or lower than a predetermined temperature and the reading mode signal FMS indicating the low speed reading mode is supplied from outside, the timing control circuit 18a performs a power-down process in which the voltage divider 14 and the comparator 15 are intermittently set to be in the stop state as in the operation introduced in FIG. 3, as shown in FIG. 4. Note that an effect obtained from the power-down process is similar to that obtained when the operation shown in FIG. 3 is performed.

On the other hand, when the reading mode signal FMS has the logic level 0 indicating a high speed reading mode, the timing control circuit 18a generates the voltage monitoring activation signal ENS that is fixed to the logic level 1 as shown in FIG. 5. That is, when the inside of the power supply circuit is in a high temperature state in which a temperature is higher than the predetermined temperature, or while the reading mode signal FMS indicating the high speed reading mode is supplied from outside, the timing control circuit 18a sets the voltage divider 14 and the comparator 15 to be in the operation state at all times.

Accordingly, even if the power-down mode is cancelled, when the boosted voltage VCP is lower than the target voltage VWL, the charge pump operation is immediately started as shown in FIG. 5. Thus, a decrement of the voltage value of the boosted voltage VCP can be suppressed compared with the case where the power-down process is performed, and therefore a reading operation margin with respect to the memory cell array 101 can be increased.

In addition, if the voltage divider 14 and the comparator 15 are set to be in operation states at all times, it is not necessary to take account of the time delay until the divided voltage VDE stabilizes, and thus the responsiveness of the comparator 15 is increased and the accuracy of converging the boosted voltage VCP to the target voltage VWL is increased, and thus the reading margin can be increased.

Here, in the power supply circuit equipped with the charge pump, a ratio of an amount of power consumption of a voltage monitoring circuit (the comparator and the voltage divider) that monitors values of the boosted voltage to an amount of power consumption of the entire power supply circuit increases in a low speed reading mode of the memory. Thus, it is difficult to achieve a further decrease in power consumption in the low speed reading mode. On the other hand, in the high speed reading mode of the memory, a range of voltage fluctuation of a selection voltage applied to the word lines, i.e., a range of voltage fluctuation of the boosted voltage, needs to be reduced.

Thus, in the configuration shown in FIG. 4, as shown in FIG. 5, while the voltage divider 14 and the comparator 15 are intermittently stopped to suppress an amount of power consumption in the low speed reading mode, the voltage divider 14 and the comparator 15 are set to operate at all times in the high speed reading mode to suppress the range of voltage fluctuation of the boosted voltage. Accordingly, conditions required for both the low speed reading mode and the high speed reading mode are satisfied.

In addition, in the configuration shown in FIG. 4, the voltage divider 14 and the comparator 15 are set to operate at all times by forcedly setting the high speed reading mode when the inside of the semiconductor storage device is at a higher temperature than a predetermined temperature, in order to suppress the decrease in a boosted voltage accompanying an off-leak current that increases at a high temperature in the semiconductor storage device. Accordingly, even if the off-leak current increases at the high temperature, it is possible to suppress the decrease in the boosted voltage.

Note that, in the above-described embodiment, the timing control circuit 18a causes the voltage monitoring activation signal ENS to be fixed to the state of the logic level 1 in the high speed reading mode as shown in FIG. 5, and accordingly the voltage divider 14 and the comparator 15 are set to be in the operation state at all times. However, even in the high speed reading mode, the voltage divider 14 and the comparator 15 may be intermittently activated as in the low speed reading mode. In that case, however, the length of the predetermined interval T1 is set to be shorter than that in the low speed reading mode, or the length of the activation period T2 is set to be longer than that in the low speed reading mode.

In addition, in the above-described embodiment, the boosted voltage VCP generated by the charge pump unit 13 of the power supply circuit 300 is used as the voltage value of the selection voltage to be applied to the word lines WL of the memory cell array 101. However, the charge pump unit 13 may first generate a voltage having a value higher than the voltage value of the selection voltage as the boosted voltage VCP, then generate a step-down voltage obtained by stepping down the boosted voltage VCP to the voltage value of the selection voltage, and supply the step-down voltage to the row decoder 102 as the voltage value of the selection voltage.

Figure 6:
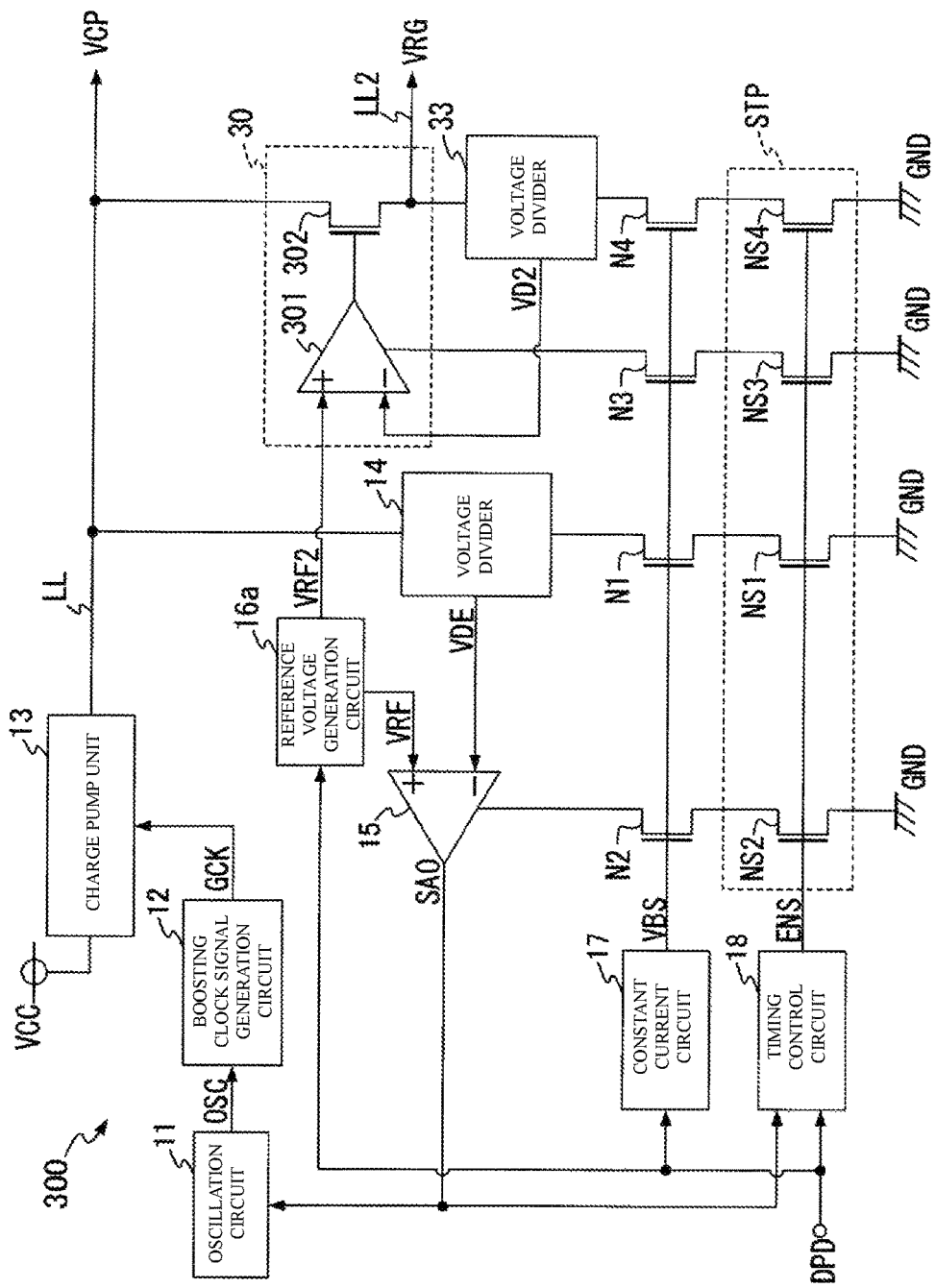
FIG. 6 is a block diagram showing another example of a configuration of the power supply circuit 300.

FIG. 6 is a block diagram showing a configuration of the power supply circuit 300 conceived in consideration of the above-described point. Note that, the configuration shown in FIG. 6 is the same as that shown in FIG. 2 except for the points that a reference voltage generation circuit 16a is employed in place of the reference voltage generation circuit 16, and a step-down circuit 30, a voltage divider 33, and n-channel MOS transistors N3, N4, NS3, and NS34 are newly provided.

In FIG. 6, the reference voltage generation circuit 16a generates a reference voltage VRF2 having a voltage value corresponding to the target voltage VWL when a voltage value of the boosted voltage VCP is stepped down, along with the above-described reference voltage VRF, and supplies the reference voltage VRF2 to the step-down circuit 30. Note that the reference voltage generation circuit 16a generates a voltage higher than the reference voltage VRF2 as the above-described reference voltage VRF, and supplies it to the comparator 15. Thus, when the configuration shown in FIG. 6 is employed for the power supply circuit 300, the boosted voltage VCP becomes a voltage at which the voltage value fluctuates high and low with the voltage value higher than the target voltage VWL that is the target of the voltage value of the selection voltage as a center.

The step-down circuit 30 includes a comparator 301 and an n-channel MOS transistor 302. The comparator 301 is formed of, for example, an op-amp comparator, generates an error voltage corresponding to the difference between the reference voltage VRF2 and a detection voltage VD2 supplied from the voltage divider 33, and supplies the error voltage to a gate terminal of the transistor 302. A source terminal of the transistor 302 is connected to the voltage supply line LL, and a drain terminal thereof is connected to a voltage supply line LL2 and the voltage divider 33. The voltage divider 33 is configured with a plurality of transistors each of which is connected to a diode in a cascade connection, like the voltage divider 14 shown in FIG. 2, or as a ladder resistor in which a plurality of resistive elements are connected in series. The voltage divider 33 supplies a divided voltage obtained by dividing a voltage of the voltage supply line LL2 to the comparator 301 as the above-described detection voltage VD2.

With the above-described configuration, the step-down circuit 30 and the voltage divider 33 supply a voltage obtained by stepping down the boosted voltage VCP to the target voltage VWL that is the target of the voltage value of the selection voltage to the row decoder 102 via the voltage supply line LL2 as a selection voltage VRG.

Furthermore, like the comparator 15, that the comparator 301 is also equipped with a differential pair (not shown) and a bias transistor that sets an operation current flowing in the differential pair, and this bias transistor is depicted outside the comparator 301 as the transistor N3 in FIG. 6. The above-described bias voltage VBS is supplied to a gate terminal of the transistor N3, and a drain terminal of the transistor NS3 is connected to a source terminal of the transistor N3. The above-described voltage monitoring activation signal ENS is supplied to a gate terminal of the transistor NS3, and a ground potential GND is applied to a source terminal of the transistor NS3. In this case, the transistor NS3 enters an on-state in accordance with the voltage monitoring activation signal ENS with the logic level 1 and supplies a voltage corresponding to the ground potential GND to the source terminal of the transistor N3, like NS2. On the other hand, when the voltage monitoring activation signal ENS with the logic level 0 is supplied, the transistor NS3 enters an off-state, the supply of the voltage to the source terminal of the transistor N3 is stopped, and an inflow of the operation current to the comparator 301 is stopped. Accordingly, the comparator 301 enters an operation stop state.

In addition, the voltage divider 33 is connected to the transistor N4 which sets an amount of current flowing in the voltage divider 33, like the voltage divider 14. The bias voltage VBS for determining a value of a current flowing in the voltage divider 33 is supplied to a gate terminal of the transistor N4, and a drain terminal of the transistor NS4 is connected to a source terminal of the transistor N4. The voltage monitoring activation signal ENS with the logic level 0 or 1 is supplied to a gate terminal of the transistor NS4, and a ground potential GND is applied to a source terminal of the transistor NS4. The transistor NS4 enters an on-state in accordance with the voltage monitoring activation signal ENS with the logic level 1, and supplies a voltage corresponding to the ground potential GND to the source terminal of the transistor N4. On the other hand, when the voltage monitoring activation signal ENS with the logic level 0 is supplied, the transistor NS4 enters an off-state, and thus the supply of the voltage to the source terminal of the transistor N4 is stopped. Thus, in this configuration, a current having a magnitude corresponding to the bias voltage VBS flows in the voltage divider 33 only when the transistor NS4 is in the on-state in accordance with the voltage monitoring activation signal ENS with the logic level 1. During this time, the voltage divider 33 supplies a voltage obtained by dividing the voltage of the voltage supply line LL2 to the comparator 301 as the above-described detection voltage VD2. On the other hand, when the voltage monitoring activation signal ENS with the logic level 0 is supplied, the transistor NS4 enters the off-state, thus no current flows in the voltage divider 33, and accordingly the voltage divider 33 enters an operation stop state.

As described above, the transistors NS3 and NS4 are included in the current blocking circuit STP, along with the transistors NS1 and NS2 in the configuration shown in FIG. 6.

Here, when the configuration shown in FIG. 6 is employed, the boosted voltage VCP and the selection voltage VRG output from the power supply circuit 300 are supplied to the row decoder 102.

Figure 7:
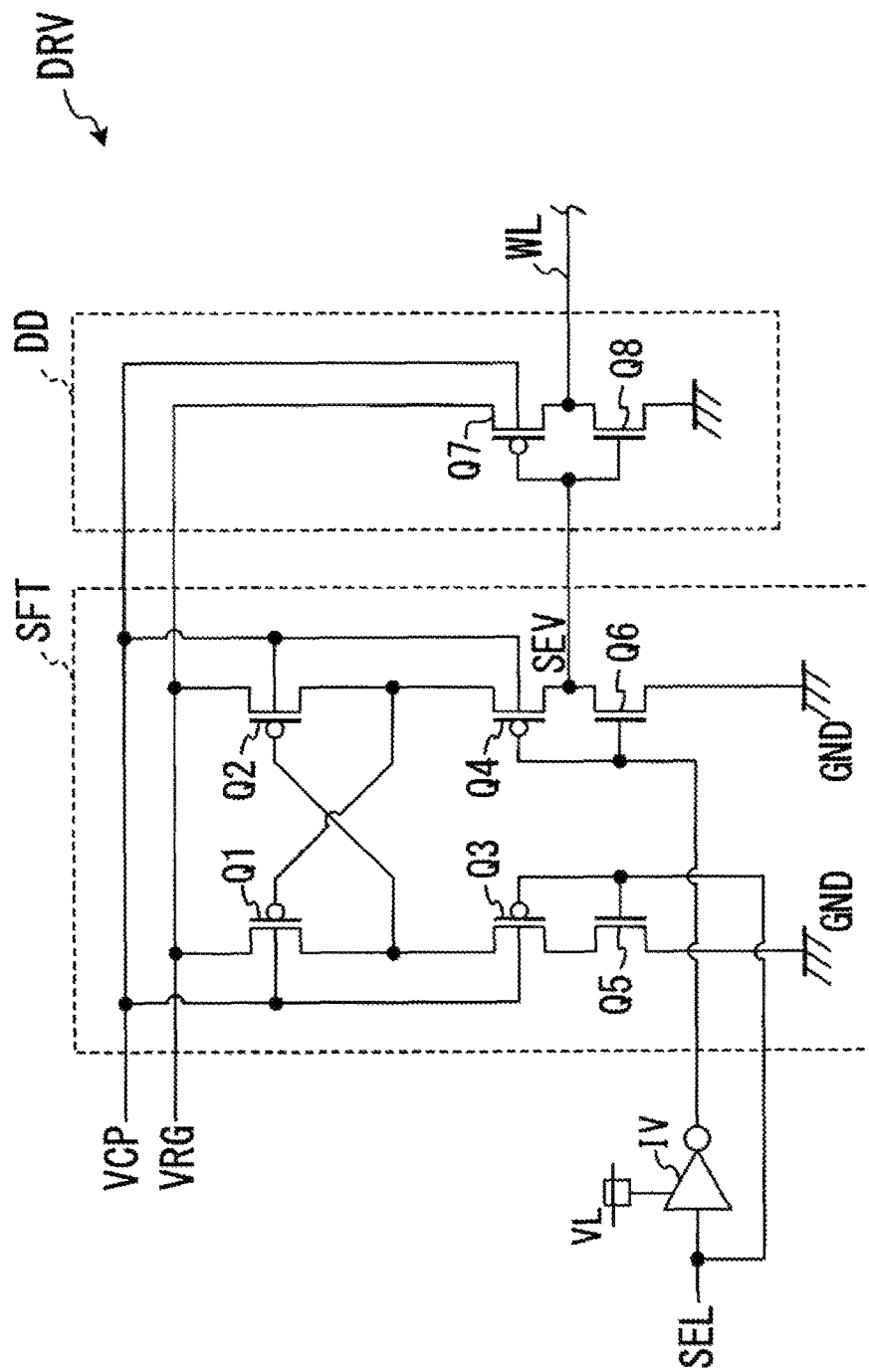
FIG. 7 is a circuit diagram showing a configuration of a drive circuit DRV included in a row decoder 102.

FIG. 7 is a circuit diagram showing one of the n-series drive circuit DRV formed correspondingly to the word lines $WL_1$ to $WL_n$ in the row decoder 102. As shown in FIG. 7, the drive circuit DRV includes an inverter IV, a level shift circuit SFT, and an output unit DD.

The level shift circuit SFT includes p-channel MOS transistors Q1 to Q4 and n-channel MOS transistors Q5 and Q6.

A voltage VRG for the selection voltage output from the power supply circuit 300 is supplied to the source terminals of the transistors Q1 and Q2. In addition, a gate terminal of the transistor Q1 is connected to a drain terminal of the transistor Q2, and a gate terminal of the transistor Q2 is connected to the drain terminal of the transistor Q1.

The drain terminal of the transistor Q1 is connected to a source terminal of the transistor Q3, and a drain terminal of the transistor Q3 is connected to a drain terminal of the transistor Q5. A ground potential GND is applied to a source terminal of the transistor Q5.

In addition, the drain terminal of the transistor Q2 is connected to a source terminal of the transistor Q4, and a drain terminal of the transistor Q4 is connected to a drain terminal of the transistor Q6. A ground potential GND is applied to a source terminal of the transistor Q6.

The inverter IV operates by receiving a source voltage VL for a logic circuit, and supplies a selection signal supplied from the memory control unit 103, that is, a signal obtained by inverting the logic level of a binary selection signal SEL (with the logic level 0 or 1) specifying whether to select a word line WL to the gate terminals of the transistors Q4 and Q6. The selection signal SEL itself is supplied to the gate terminals of the transistors Q3 and Q5.

Further, the boosted voltage VCP output from the power supply circuit 300 is applied to the back gates of the transistors Q1 to Q4, i.e., n-well areas of the p-channel MOS transistors.

With this configuration, the level shift circuit SFT generates a binary selection signal SEV by shifting a level of the selection signal SEL corresponding to the source voltage VL to a level of a voltage value of a selection voltage, i.e., a level of the voltage VRG, and supplies the signal to the output unit DD.

The output unit includes a p-channel MOS transistor Q7 and an n-channel MOS transistor Q8. The voltage VRG for the selection voltage output from the power supply circuit 300 is supplied to a source terminal of the transistor Q7, and a gate terminal of the transistor Q8 is connected to a gate terminal of the transistor Q7. A drain terminal of the transistor Q7 is connected to a drain terminal of the transistor Q8 and the word lines WL of the memory cell array 101. The ground potential GND is applied to a source terminal of the transistor Q8. Furthermore, the boosted voltage VCP output from the power supply circuit 300 is applied to a back gate of the transistor Q7, i.e., an n-well area of the p-channel MOS transistor.

The output unit DD receives the binary selection signal SEV at the gate terminals of the transistors Q7 and Q8, and supplies a binary selection voltage obtained by inverting the logic level of the selection signal SEL to the word lines WL.

According to this configuration, as in the case of adopting the configuration shown in FIG. 2, the voltage divider 14 and the comparator 15 are intermittently stopped after the initial boosting period ING shown in FIG. 3, so that a reduction in an amount of power consumption can be achieved. Since the step-down circuit 30 and the voltage divider 33 are added, power consumption is higher than that in the configuration shown in FIG. 2. However, with the transistors NS3 and NS4 shown in FIG. 6, the step-down circuit 30 and the voltage divider 33 are intermittently stopped as the voltage divider 14 and the comparator 15 are, so that an increment of power consumption is suppressed.

Furthermore, in the configurations shown in FIG. 6 and FIG. 7, the voltage VRG obtained by the step-down circuit 30 stepping down the boosted voltage VCP which is generated by the charge pump unit 13 is used as the selection voltage. Thus, an amount of voltage fluctuation occurring in the voltage VRG obtained by stepping down the boosted voltage VCP is lower than that of the boosted voltage VCP generated by the charge pump unit 13. Thus, as compared with the case where the boosted voltage VCP generated by the charge pump section 13 is directly used as the voltage of the selection voltage, the voltage fluctuation of the selection voltage is reduced and reliable data reading can be performed.

In addition, in the configurations shown in FIG. 6 and FIG. 7, the boosted voltage VCP that is higher than the voltage VRG is applied to the back gates of the p-channel MOS transistors formed in the drive circuit DRV, i.e., the n-well areas of the p-channel MOS transistors. Thus, the off-leak current flowing in the p-channel MOS transistors of the drive circuit DRV can be suppressed due to a substrate effect of a semiconductor substrate, and thus power consumption can be further reduced.

Further, instead of the timing control circuit 18 shown in FIG. 6, the high-temperature sensor 19, the timing control circuit 18a, and the OR gate 20 as shown in FIG. 4 may be employed so that the control based on the reading mode signal FMS and the high temperature detection signal TH may be adopted In this case, in the configurations shown in FIG. 6 and FIG. 7, as in the configuration shown in FIG. 4, the voltage dividers (14 and 33) and the comparators (15 and 301) are intermittently stopped in the low speed reading mode or the suitable temperature state so that the amount of power consumption is suppressed,. On the other hand, the voltage dividers and the comparators are operated at all times in the high speed reading mode or the high temperature state so that the voltage fluctuation range of the boosted voltage is suppressed. Accordingly, the conditions required in the low speed reading mode (the suitable temperature state) and the high speed reading mode (the high temperature state) are satisfied.

What is claimed is:

1. A power supply circuit that includes a charge pump unit generating and outputting a boosted voltage obtained by boosting a source voltage, the circuit comprising:
    a voltage monitoring unit, performing comparison and determination on magnitudes of a divided voltage obtained by dividing the boosted voltage and a predetermined reference voltage;
    a charge pump control unit, causing the charge pump unit to operate when the divided voltage is equal to or lower than the reference voltage based on a result of the comparison and determination and causing an operation of the charge pump unit to stop when the divided voltage is higher than the reference voltage based on a result of the comparison and determination; and
    a voltage monitoring control unit, causing the voltage monitoring unit to intermittently stop.

2. The power supply circuit according to claim 1, wherein the voltage monitoring control unit receives a first operation mode signal indicating a standby mode or a power-down mode and causes the voltage monitoring unit to operate at all times in an initial boosting period from a time point at which the first operation mode signal transitions from the standby mode to the power-down mode to a time point at which the divided voltage transitions to a voltage higher than the reference voltage for the first time, and causes the voltage monitoring unit to intermittently stop after the initial boosting period.

3. The power supply circuit according to claim 2, wherein the voltage monitoring control unit causes the voltage monitoring unit to operate only in a predetermined activation period, which is shorter than a predetermined interval, at each of the predetermined intervals after the initial boosting period, and causes the voltage monitoring unit to stop in a period other than the activation period.

4. The power supply circuit according to claim 3,
    wherein the voltage monitoring unit includes a voltage divider for dividing the boosted voltage and generating the divided voltage, and a comparator for performing comparison and determination on magnitudes of the divided voltage and the reference voltage, and
    wherein the voltage monitoring control unit includes a current blocking circuit for blocking a current flowing inside the voltage divider and the comparator in periods other than the activation period after the initial boosting period.

5. The power supply circuit according to claim 4,
wherein the predetermined interval is a time longer than a time from a time point when the charge pump unit transitions from an operation state to a stop state to a time point when a voltage value of the boosted voltage decreases to a minimum allowable voltage of a load of a supply destination of the boosted voltage in a state in which the voltage value of the boosted voltage is equal to or higher than a predetermine target voltage, and wherein the activation period has a period equal to or longer than a time obtained by adding a time from a time point when the divided voltage that was higher than the reference voltage transitions to being lower than the reference voltage to a time point when a value of the divided voltage reaches the reference voltage due to a boosting operation of the charge pump unit to a circuit delay time in the voltage divider.

6. The power supply circuit according to claim 3, wherein the voltage monitoring control unit receives a second operation mode signal indicating a low speed reading mode or a high speed reading mode, and causes the voltage monitoring unit to operate only in the activation period at each of the predetermined intervals after the initial boosting period when the second operation mode signal indicates the low speed reading mode, and causes the voltage monitoring unit to operate at all times when the second operation mode signal indicates the high speed reading mode.

7. The power supply circuit according to claim 3, wherein the voltage monitoring control unit receives a second operation mode signal indicating a low speed reading mode or a high speed reading mode, and causes the voltage monitoring unit to operate only in the activation period at each of the predetermined intervals after the initial boosting period when the second operation mode signal indicates the low speed reading mode, and causes the voltage monitoring unit to operate only in the activation period at each interval that is shorter than the predetermined interval when the second operation mode signal indicates the high speed reading mode.

8. The power supply circuit according to claim 3, comprising:
a high temperature sensor, detecting a surrounding temperature and generating a high temperature detection signal that indicates a high temperature state in which the temperature is higher than a predetermined temperature or indicates a suitable temperature state in which the temperature is equal to or lower than the predetermined temperature,
wherein the voltage monitoring unit is caused to operate only in the activation period at each of the predetermined intervals after the initial boosting period when the high temperature detection signal indicates the suitable temperature state, and the voltage monitoring unit is caused to operate at all times when the high temperature detection signal indicates the high temperature state.

9. The power supply circuit according to claim 3, comprising:
a high temperature sensor, detecting a surrounding temperature and generating a high temperature detection signal that indicates a high temperature state in which the temperature is higher than a predetermined temperature or indicates a suitable temperature state in which the temperature is equal to or lower than the predetermined temperature is included,
wherein the voltage monitoring unit is caused to operate only in the activation period at each of the predetermined intervals after the initial boosting period when the high temperature detection signal indicates the suitable temperature state, and the voltage monitoring unit is caused to operate only in the activation period at a interval that is shorter than the predetermined interval when the high temperature detection signal indicates the high temperature state.

10. The power supply circuit according to claim 1, comprising:
a step-down circuit, generating and outputting a step-down voltage by stepping down the boosted voltage.

11. A semiconductor storage device that includes a power supply circuit that includes a charge pump unit for generating a boosted voltage by boosting a source voltage; a memory cell array in which memory cells are formed at intersections of a plurality of word lines and a plurality of bit lines crossing each of the word lines; and a row decoder for supplying a selection voltage to each of the word lines based on the boosted voltage,
wherein the power supply circuit comprises:
a voltage monitoring unit, performing comparison and determination on magnitudes of a divided voltage obtained by dividing the boosted voltage and a predetermined reference voltage;
a charge pump control unit, causing the charge pump unit to operate when the divided voltage is equal to or lower than the reference voltage based on a result of the comparison and determination and causing an operation of the charge pump unit to stop when the divided voltage is higher than the reference voltage based on a result of the comparison and determination; and
a voltage monitoring control unit, causing the voltage monitoring unit to intermittently stop.

12. The semiconductor storage device according to claim 11, comprising:
a step-down circuit, generating a step-down voltage by stepping down the boosted voltage and supplies the step-down voltage to the row decoder is included.

13. The semiconductor storage device according to claim 11,
wherein the row decoder comprises a driver for supplying a selection voltage to the word line in accordance with a selection signal for selecting the word line, and
wherein the driver comprises a plurality of p-channel MOS transistors that operate with reception of the step-down voltage, and the boosted voltage is applied to an n-well area of each of the transistors.

* * * * *